US006838905B1

(12) United States Patent
Doyle

(10) Patent No.: US 6,838,905 B1
(45) Date of Patent: Jan. 4, 2005

(54) LEVEL TRANSLATOR FOR HIGH VOLTAGE DIGITAL CMOS PROCESS

(75) Inventor: James Thomas Doyle, Nederland, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/272,028

(22) Filed: Oct. 15, 2002

(51) Int. Cl.$^7$ .................................. H03K 19/0175
(52) U.S. Cl. ...................... 326/81; 326/68; 326/80
(58) Field of Search .......................... 326/68, 80, 81, 326/82, 83; 327/333

(56) References Cited

U.S. PATENT DOCUMENTS

| | | | | |
|---|---|---|---|---|
| 4,656,373 A | * | 4/1987 | Plus ........................... | 326/81 |
| 5,444,396 A | * | 8/1995 | Soneda ....................... | 326/81 |
| 5,559,464 A | * | 9/1996 | Orii et al. .................. | 327/333 |
| 5,559,996 A | * | 9/1996 | Fujioka ...................... | 703/23 |
| 5,583,460 A | * | 12/1996 | Dohi et al. ................. | 327/126 |
| 6,097,214 A | * | 8/2000 | Troussel et al. ............ | 326/63 |
| 6,099,100 A | | 8/2000 | Lee ............................ | 328/81 |
| 6,433,582 B2 | * | 8/2002 | Hirano ....................... | 326/68 |
| 2001/0011917 A1 | | 8/2001 | Kim et al. | |
| 2001/0013795 A1 | | 8/2001 | Nojiri | |

OTHER PUBLICATIONS

Dragan Maksimovic, Bruno Kranzen, Sandeep Dhar and Ravindra Ambatipudi, U.S. patent application No. 10/053,226, filed Jan. 19, 2002, entitled "An Adaptive Voltage Scaling Digital Processing Component and Method of Operating the Same".

Bruno Kranzen and Dragen Maksimovic, U.S. patent application No. 10/053,227, filed Jan. 19, 2002, entitled "Adaptive Voltage Scaling Clock Generator for Use in a Digital Processing Component and Method of Operating the Same".
Dragan Maksimovic and Sandeep Dhar, U.S. patent application No. 10/053,828, filed Jan. 19, 2002, entitled "System for Adjusting a Power Supply Lev el of a Digital Processing Component and Method of Operating the Same".
Dragan Maksimovic, Ravindra Ambatipudi, Sandeep Dhar and Bruno Krazen, U.S. patent application No. 10/053,228, filed Jan. 19, 2002, entitled "An Adaptive Voltage Scaling Power Supply for Use in a Digital Processing Component and Method of Operating the Same".
James T. Doyle and Dragan Maksimovic, U.S. patent application No. 10/160,428, filed Mar. 26, 2002, entitled "Meth od and System for Minimizing Power Consumption in Mobile Devices Using Cooperative Adaptive Voltage and Threshold Scaling".
Dragan Maksimovic and James Thomas Doyle, U.S. patent application No. 10/166,822, filed Jun. 10, 2002, entitled "Serial Digital Communication Superimposed on a Digital Signal Over a Single Wire".
Dragan Maksimovic and Sandeep Dhar, U.S. patent application No. 10/236,482, filed Sep. 6, 2002, entitled "Meth od and System for Providing Self–Calibration for Adaptively Adjusting a Power Supply Voltage in a Digital Processing System".

(List continued on next page.)

Primary Examiner—Anh Q. Tran
(74) Attorney, Agent, or Firm—Mark C. Pickering

(57) ABSTRACT

The speed of a level shifter is increased by utilizing an additional transistor to pull down the voltage on a first intermediate node, and an additional transistor to pull down the voltage on a second intermediate node. In addition, a precharge circuit is utilized to precharge the voltage on the first and second intermediate nodes to further increase the speed of the level shifter.

16 Claims, 6 Drawing Sheets

OTHER PUBLICATIONS

Mark F. Rives, U.S. patent application No. 10/246,971, filed Sep. 19, 2002, entitled "Power Supply System and Method that Utilizes an Open Loop Power Supply Control".

Jim Doyle and Bill Broach, Small Gains in Power Efficiency Now, Bigger Gains Tomorrow [online]. Jul. 9, 2002 [retrieved on Feb. 1, 2003]. Retrieved from the Internet: <URL: http://www.commsdesign.com/design_corner/OEG20020709S0022>. pps. 1–5.

Robert W. Erickson and Dragan Maksimovic, *Fundamentals of Power Electronics,* Second Edition, Kluwer Academic Publishers, 2001, pp. 333.

Krisztian Flautner, Steven Reinhardt and Trevor Mudge, Automatic Performance Setting for Dynamic Voltage Scaling, Wireless Networks, vol. 8, Issue 5, Sep. 2002, pps. 507–520, and Citation, pps. 1–3, [online]. [retrieved on Feb. 2, 2003]. Retrieved from the Internet: <URL: http://portal.acm.org/citation.cfm?id=582455.582463&coll=portal&dl=ACM&idx=J804&p . . . >.

Krisztian Flautner, Steven Reinhardt, and Trevor Mudge, Automatic Performance Setting for Dynamic Voltage Scaling [online]. May 30, 2001, [retrieved on Feb. 2, 2003]. Retrieved from the Internet: <URL http://www.eecs.umich.edu/~tnm/papers/mobicom01.pdf>. pps. 1–12.

Texas Instruments, "Synchronous–Buck PWM Controller With NMOS LDO Controller", TPS5110, SLVS025A—Apr. 2002, Revised Jun. 2002.

Intel XScale Core, Developer's Manual, Dec. 2000, [online], [retrieved on Feb. 2, 2003]. Retrieved from the Internet: <URL http://developer.intel.com/design/intelxscale/27347301.pdf>. pps. 1–1 through B–1.

\* cited by examiner

LEVEL TRANSLATOR FOR HIGH VOLTAGE DIGITAL CMOS PROCESS

RELATED APPLICATION

The present invention is related to application Ser. No. 10/272,035 for "Driver with Bulk Switching MOS Power Transistor" by James Thomas Doyle and Michael Angelo Tamburrino, and application Ser. No. 10/272,027 for "All Digital Power Supply System and Method that Provides a Substantially Constant Supply Voltage over Changes in PVT Without a Band Gap Reference Voltage" by James Thomas Doyle and Dae Woon Kang, both filed on an even date herewith.

BACKGROUND OF THE INVENTION

1. Field of the Invention

The present invention relates to level shifters and, more particularly, to a high-speed level shifter.

2. Description of the Related Art

A level shifter is a common circuit device that is used to translate a voltage from a first voltage level to a second voltage level. For example, deep sub-micron digital circuits represent a logic one with a voltage of approximately 1.2 volts. When these circuits communicate with other circuits that represent a logic one with a voltage of approximately 3.6 volts, a level shifter is used to shift the 1.2 volt level to a 3.6 volt level.

FIG. 1 shows a circuit diagram that illustrates an example of a prior art level shifter 100. As shown in FIG. 1, level shifter 100 includes an input stage 110 that receives an input digital signal IN, and outputs an inverted input signal INV and a non-inverted input signal IVM. Input stage 110 has a first inverter IV1 that inverts the input digital voltage IN and outputs the inverted input signal INV, and a second inverter IV2 that inverts the inverted input signal INV and outputs the non-inverted input signal IVN.

First inverter IV1 includes a PMOS transistor M36 that has a source connected to a first power supply VDD1, such as 1.2V, a drain, and a gate connected to receive the input signal IN. In addition, first inverter IV1 also includes an NMOS transistor M35 that has a source connected to ground, a drain connected to the drain of PMOS transistor M36, and a gate connected to receive the input signal IN.

Second inverter IV2 includes a PMOS transistor M25 that has a source connected to the first power supply VDD1, a drain, and a gate connected to receive the output of inverter IV1. In addition, second inverter IV2 also includes an NMOS transistor M24 that has a source connected to ground, a drain connected to the drain of PMOS transistor M24, and a gate connected to output of inverter IV1.

Level shifter 100 also includes a pull-down stage 112 that pulls down the voltage on a first intermediate node NIM1 when the input voltage IN is a logic low (e.g., zero volts) and the inverted input voltage INV is a logic high (e.g., 1.2V). Level shifter 100 also pulls down the voltage on a second intermediate node NIM2 when the input voltage IN is a logic high (e.g. 1.2 volts) and the non-inverted signal IVM is a logic high.

Pull down stage 112 includes a NMOS transistor M38 and a NMOS transistor M39. NMOS transistor M38 has a source connected to ground, a drain connected to the first intermediate node NIM1, and a gate connected to the drains of transistors M35 and 36 of inverter IV1. NMOS transistor M39 has a source connected to ground, a drain connected to the second intermediate node NIM2, and a gate and the drains of transistors M25 and 24 of inverter IV2.

Level shifter 100 also includes a cross-coupled pull-up stage 114 that pulls up the voltage on the first intermediate node NIM1 to a level shifted voltage (e.g., 3.6 volts) when the input voltage IN is a logic high. Stage 114 also pulls up the voltage on the second intermediate node NIM2 to the level shifted voltage when the input voltage IN is a logic low.

Pull up stage 114 includes a PMOS transistor M14 and a PMOS transistor M13. PMOS transistor M14 has a source connected to a second power supply VDD2 (e.g., 3.6 volts), a drain connected to the first intermediate node NIM1, and a gate connected to the second intermediate node NIM2. PMOS transistor M13 has a source connected to the second power supply VDD2, a drain connected to the second intermediate node NIM2, and a gate connected to the first intermediate node NIM1.

Level shifter 100 also includes a buffer output stage 116 that is connected to the second intermediate node NIM2, and an inverting output stage 118 that is connected to the first intermediate node NIM1. Output stage 116 includes a third inverter IV3 that inverts the voltage on the second intermediate node NIM2, and a fourth inverter IV4 that inverts the voltage output from inverter IV3.

Third inverter IV3 includes a PMOS transistor M49 that has a source connected to the power supply VDD2, a drain, and a gate connected to receive the signal on the second intermediate node NIM2. In addition, third inverter IV3 also includes an NMOS transistor M48 that has a source connected to ground, a drain connected to the drain of PMOS transistor M49, and a gate connected to receive the signal on the second intermediate node NIM2.

Fourth inverter IV4 includes a PMOS transistor M31 that has a source connected to the second power supply VDD2, a drain, and a gate connected to receive the output of inverter IV3. In addition, second inverter IV4 also includes an NMOS transistor M30 that has a source connected to ground, a drain connected to the drain of PMOS transistor M31, and a gate connected to output of inverter IV3.

Output stage 118 includes a fifth inverter IV5 that inverts the voltage on the first intermediate node NIM1. Fifth inverter IV5 includes a PMOS transistor M52 that has a source connected to the power supply VDD2, a drain, and a gate connected to receive the signal on the first intermediate node NIM1.

In addition, fifth inverter IV5 also includes an NMOS transistor M53 that has a source connected to ground, a drain connected to the drain of PMOS transistor M52, and a gate connected to receive the signal on the first intermediate node NIM1. Inverter IV5 also provides balance such that the first and second intermediate nodes NIM1 and NIM2 see the same load.

In operation, when the input voltage IN is a logic low, transistor M38 turns on in response to the logic high of the inverted input signal INV, and pulls the voltage on the first intermediate node NIM1 to ground. Transistor M39, on the other hand, turns off in response to the logic low of the non-inverted input signal IVM. Since the gate of PMOS transistor M13 is also connected to the first intermediate node NIM1, the falling voltage turns on transistor M13, thereby pulling up the voltage on the second intermediate node NIM2.

In addition, inverter IV5 inverts the logic low on the first intermediate node NIM1 to drive a logic high at the level shifted voltage, e.g., 3.6 volts. Further, inverter IV3 inverts the logic high on the second intermediate node NIM2, and inverter IV4 inverts the output of inverter IV3 to drive a logic high at the level shifted voltage.

Similarly, when the input voltage IN is a logic high, transistor M39 turns on in response to the logic high of the non-inverted input signal IVM, and pulls the voltage on the second intermediate node NIM2 to ground. Transistor M38, on the other hand, turns off in response to the logic low of the inverted input signal INV. Since the gate of PMOS transistor M14 is also connected to the second intermediate node NIM2, the falling voltage turns on transistor M14, thereby pulling up the voltage on the first intermediate node NIM1.

In addition, inverter IV5 inverts the logic high on the first intermediate node NIM1 to drive a logic low. Further, inverter IV3 inverts the logic low on the second intermediate node NIM2, and inverter IV4 inverts the output of inverter IV3 to drive a logic low.

One limitation of level shifter 100 is that level shifter 100 works poorly in high-speed applications. Thus, there is a need for a high-speed level shifter.

SUMMARY OF THE INVENTION

The present invention provides a high-speed level shifter. A level shifter in accordance with the present invention includes an input stage that receives a first signal and outputs a second signal in response to the first signal. The first and second signals have opposite logic states. The second signal has a maximum voltage.

The level shifter also includes a pull down stage that is connected to a first intermediate node, a second intermediate node, and the input stage. The pull down stage pulls down a voltage on the first intermediate node when the first signal has a first logic state, and pulls down a voltage on the second intermediate node when the input signal has a second logic state.

The pull down stage includes a first transistor that is connected to the first intermediate node, the input stage, and ground, and a second transistor that is connected to the first intermediate node, the second intermediate node, and ground. The pull down stage also includes a third transistor that is connected to the input stage, the second intermediate node, and ground, and a fourth transistor that is connected to the first intermediate node, the second intermediate node, and ground.

The level shifter additionally includes a pull-up stage that pulls up the voltage on the first intermediate node to a level shifted voltage greater than the maximum voltage when the first signal has the second logic state, and pulls up the voltage on the second intermediate node to the level shifted voltage when the first signal has the first logic state.

Further, the level shifter also includes a first inversion circuit that is connected to the first intermediate node. The first inversion circuit outputs a voltage with a logic state. The logic state of the voltage output by the first inversion circuit is opposite to a logic state of the voltage on the first intermediate node.

In addition, the level shifter can also include a second inversion circuit that is connected to the second intermediate node. The second inversion circuit outputs a voltage with a logic state. The logic state of the voltage output by the second inversion circuit is opposite to a logic state of the voltage on the second intermediate node. The level shifter can further include a voltage drop stage that is connected to the pull up stage and a power node.

The level shifter can further include a blocking circuit that has a fifth transistor connected to the first intermediate node and the pull up stage, a sixth transistor connected to the second intermediate node and the pull up stage, and a seventh transistor connected to the fifth and sixth transistors.

Further, the level shifter can include a first charging circuit that has an eighth transistor connected to the second intermediate node and the first inversion circuit. In addition, the first charging circuit can include a ninth transistor connected to the second intermediate node, the first inversion circuit, and ground, and a tenth transistor connected to the second intermediate node, the first inversion circuit, and a power node.

A better understanding of the features and advantages of the present invention will be obtained by reference to the following detailed description and accompanying drawings that set forth an illustrative embodiment in which the principles of the invention are utilized.

DETAILED DESCRIPTION OF THE INVENTION

Figure 1:
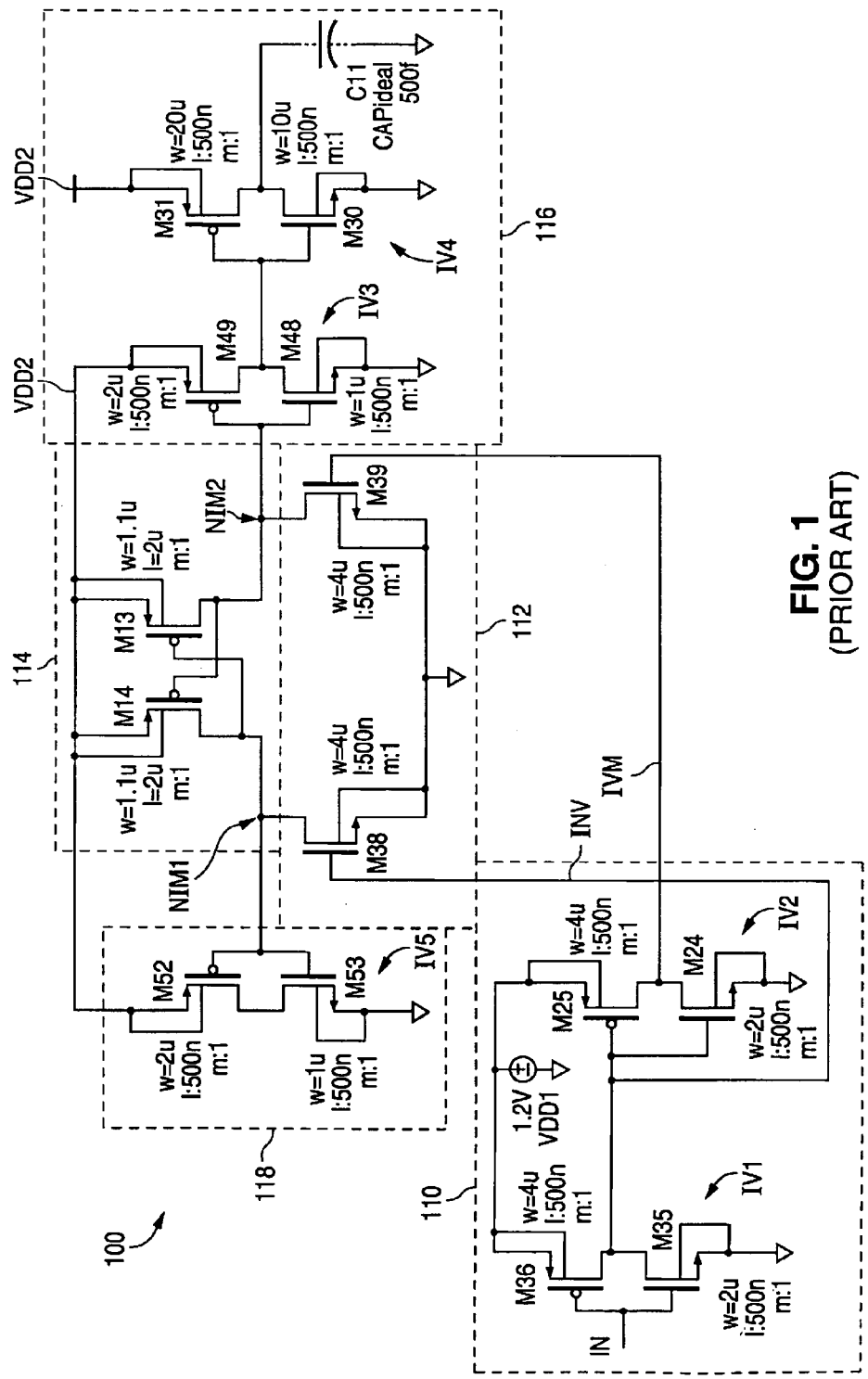
FIG. 1 is a circuit diagram illustrating an example of a prior art level shifter 100.
Figure 2:
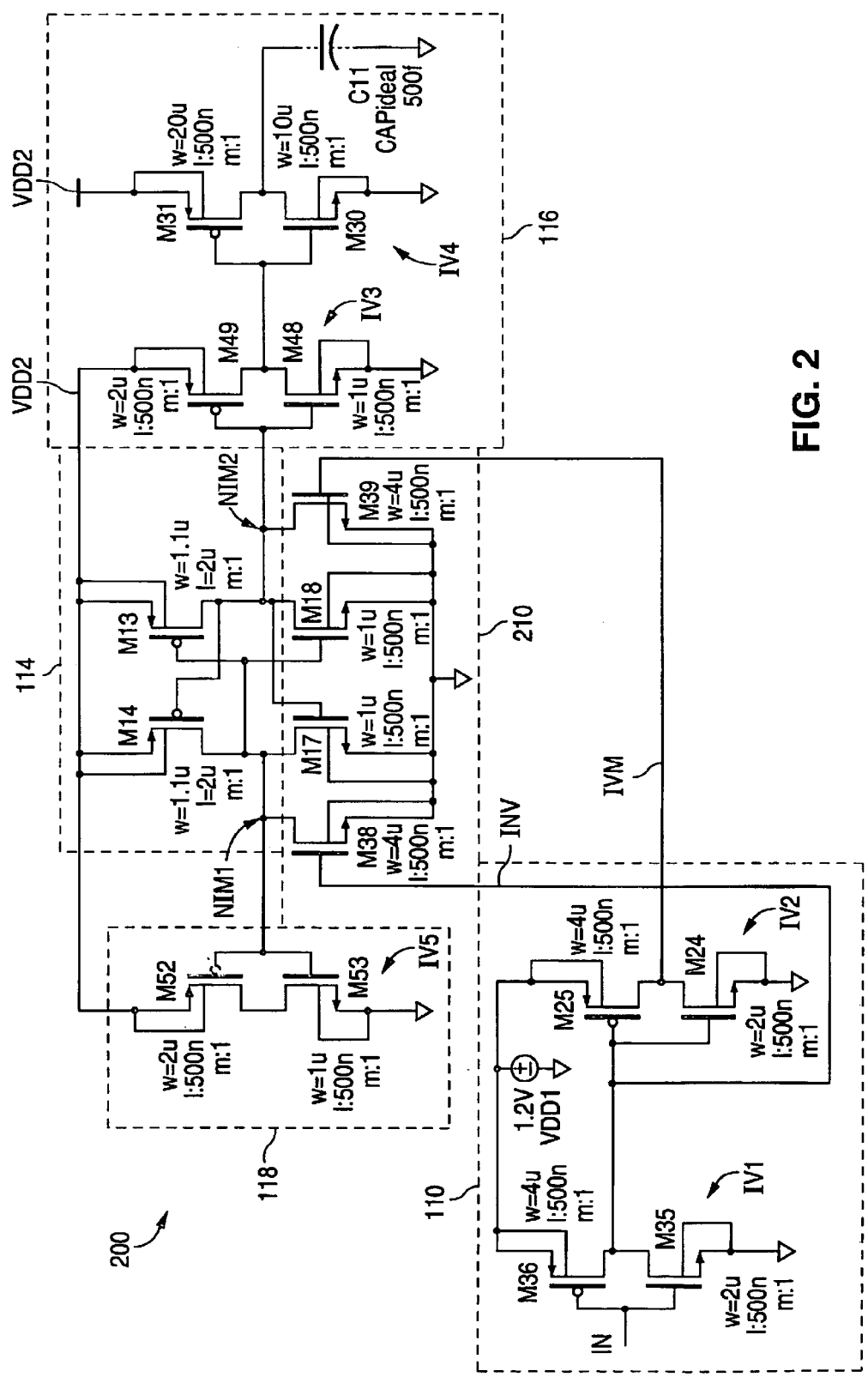
FIG. 2 is a circuit diagram illustrating an example of a level shifter 200 in accordance with the present invention.

FIG. 2 shows a circuit diagram that illustrates an example of a level shifter 200 in accordance with the present invention. Level shifter 200 is similar to level shifter 100 and, as a result, utilizes the same reference numerals to designate the structures that are common to both level shifters.

As shown in FIG. 2, level shifter 200 differs from level shifter 100 in that level shifter 200 utilizes a pull down stage 210 in lieu of pull down stage 112. Pull down stage 210, which is connected to the first intermediate node NIM1 and the second intermediate node, pulls down the voltage on the first intermediate node NIM1 when the input digital voltage IN is in a first logic state, and pulls down the voltage on the second intermediate node NIM2 when the input voltage IN is in a second logic state.

Pull down stage 210 includes a NMOS transistor M38 and a NMOS transistor M39. NMOS transistor M38 has a source connected to ground, a drain connected to the first intermediate node NIM1, and a gate connected to the drains of transistors M35 and 36 of inverter IV1. NMOS transistor M39 has a source connected to ground, a drain connected to the second intermediate node NIM2, and a gate and the drains of transistors M25 and 24 of inverter IV2.

In accordance with the present invention, pull down stage 210 also includes a NMOS transistor M17 and a NMOS transistor M18. NMOS transistor M17 has a source connected to ground, a drain connected to the first intermediate node NIM1, and a gate connected to the second intermediate node NIM2. NMOS transistor M18 has a source connected to ground, a drain connected to the second intermediate node NIM2, and a gate connected to the first intermediate node NIM1.

In operation, when the input voltage IN is a logic low, transistor M38 turns on in response to the logic high of the inverted input signal INV, and begins to pull down the voltage on the first intermediate node NIM1 to ground. Transistor M39, on the other hand, turns off in response to the logic low of the non-inverted input signal IVM.

Since the gate of PMOS transistor M13 is also connected to the first intermediate node NIM1, the falling voltage turns on transistor M13, thereby pulling up the voltage on the second intermediate node NIM2. Since the gate of NMOS transistor M17 is connected to the second intermediate node NIM2, the rising voltage on the second intermediate node NIM2 turns-on transistor M17.

When transistor M17 turns on, two transistors pull the first intermediate node NIM1 to ground. This reduces the amount of time required to pull down the voltage on the first intermediate node NIM1 past the trip voltage of inverter IV5 (the voltage where inverter IV5 changes logic states), thereby turning on inverter IV5 sooner and increasing the speed of level shifter 200.

For example, assume that the voltage on the first intermediate node NIM1 is +3.6V, that PMOS transistor M13 has a threshold voltage of −1.0V, and NMOS transistor M17 has a threshold voltage of +1.0V. Further assume that the trip voltage of inverter IV5 is +1.0V, i.e., NMOS transistor M53 turns off when the voltage on the first intermediate node NIM1 reaches +1.0V.

Thus, when transistor M38 turns on, PMOS transistor M13 turns on when the voltage on the first intermediate node NIM1 is approximately +2.6V. Transistor M38 continues to pull down the voltage on the first intermediate node NIM1 while transistor M13 charges up the voltage on the second intermediate node NIM2.

When the voltage on the second intermediate node NIM2 reaches approximately 1.0V, transistor M17 turns on and helps transistor M38 pull the voltage on the first intermediate node NIM1 down to the trip voltage (e.g., +1.0V) of transistor M53 faster, thereby increasing the speed to level shifter 200.

The low voltage on the first intermediate node NIM1 also turns off transistor M18. In addition, inverter IV5 inverts the logic low on the first intermediate node NIM1 to drive a logic high at the level shifted voltage, e.g., 3.6 volts. Further, inverter IV3 inverts the logic high on the second intermediate node NIM2, and inverter IV4 inverts the output of inverter IV3 to drive a logic high at the level shifted voltage.

On the other hand, when the input voltage IN is a logic high, transistor M39 turns on in response to the logic high of the non-inverted input signal IVM, and begins to pull down the voltage on the second intermediate node NIM2 to ground. Transistor M38, on the other hand, turns off in response to the logic low of the inverted input signal INV.

Since the gate of PMOS transistor M14 is also connected to the second intermediate node NIM2, the falling voltage turns on transistor M14, thereby pulling up the voltage on the first intermediate node NIM1. Since the gate of NMOS transistor M18 is connected to the first intermediate node NIM1, the rising voltage on the first intermediate node NIM1 turns on transistor M18.

When transistor M18 turns on, two transistors pull the second intermediate node NIM2 to ground. This reduces the amount of time required to pull down the voltage on the second intermediate node NIM2 past the trip voltage of inverter IV3 (the voltage where inverter IV3 changes logic states), thereby turning on inverter MV3 sooner and increasing the speed of level shifter 200.

For example, assume that the voltage on the second intermediate node NIM2 is +3.6V, that PMOS transistor M14 has a threshold voltage of −1.0V, and NMOS transistor M18 has a threshold voltage of +1.0V. Further assume that the trip voltage of inverter IV3 is +1.8V. Further assume that the trip voltage of inverter IV3 is +1.0V, i.e., NMOS transistor M48 turns off when the voltage on the second intermediate node NIM2 reaches +1.0V.

Thus, when transistor M39 turns on, PMOS transistor M14 turns on when the voltage on the second intermediate node NIM2 is approximately +2.6V. Transistor M39 continues to pull down the voltage on the second intermediate node NIM2 while transistor M14 charges up the voltage on the first intermediate node NIM1.

When the voltage on the first intermediate node NIM1 reaches approximately +1.0V, transistor M18 turns on and helps transistor M39 pull the voltage on the second intermediate node NIM2 down to the trip voltage (e.g., +1.0V) of transistor M48 faster, thereby increasing the speed to level shifter 200.

The low voltage on the second intermediate node NIM2 also turns off transistor M17. In addition, inverter IV5 inverts the logic high on the first intermediate node NIM1 to drive a logic low. Further, inverter IV3 inverts the logic low on the second intermediate node NIM2, and inverter IV4 inverts the output of inverter IV3 to drive a logic low.

Thus, level shifter 200 provides an increased speed by utilizing transistors M17 and M18 which, in turn, reduce the time required to pull down the voltages on the first and second intermediate nodes NIM1 and NIM2 past the trip voltages of the inverters.

Figure 3A:
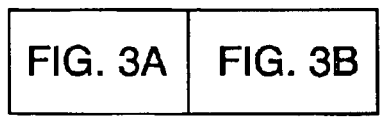
FIGS. 3A–3B are circuit diagrams illustrating an example of a level shifter 300 in accordance with an alternate embodiment of the present invention.
Figure 3A:
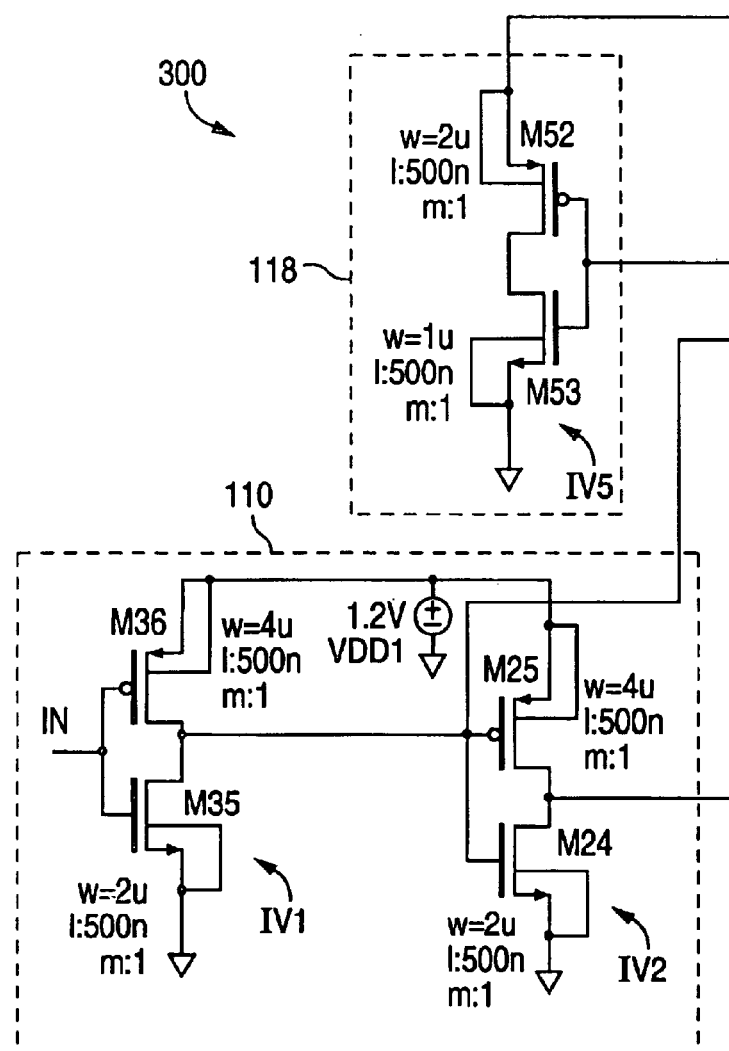
Figure 3B:
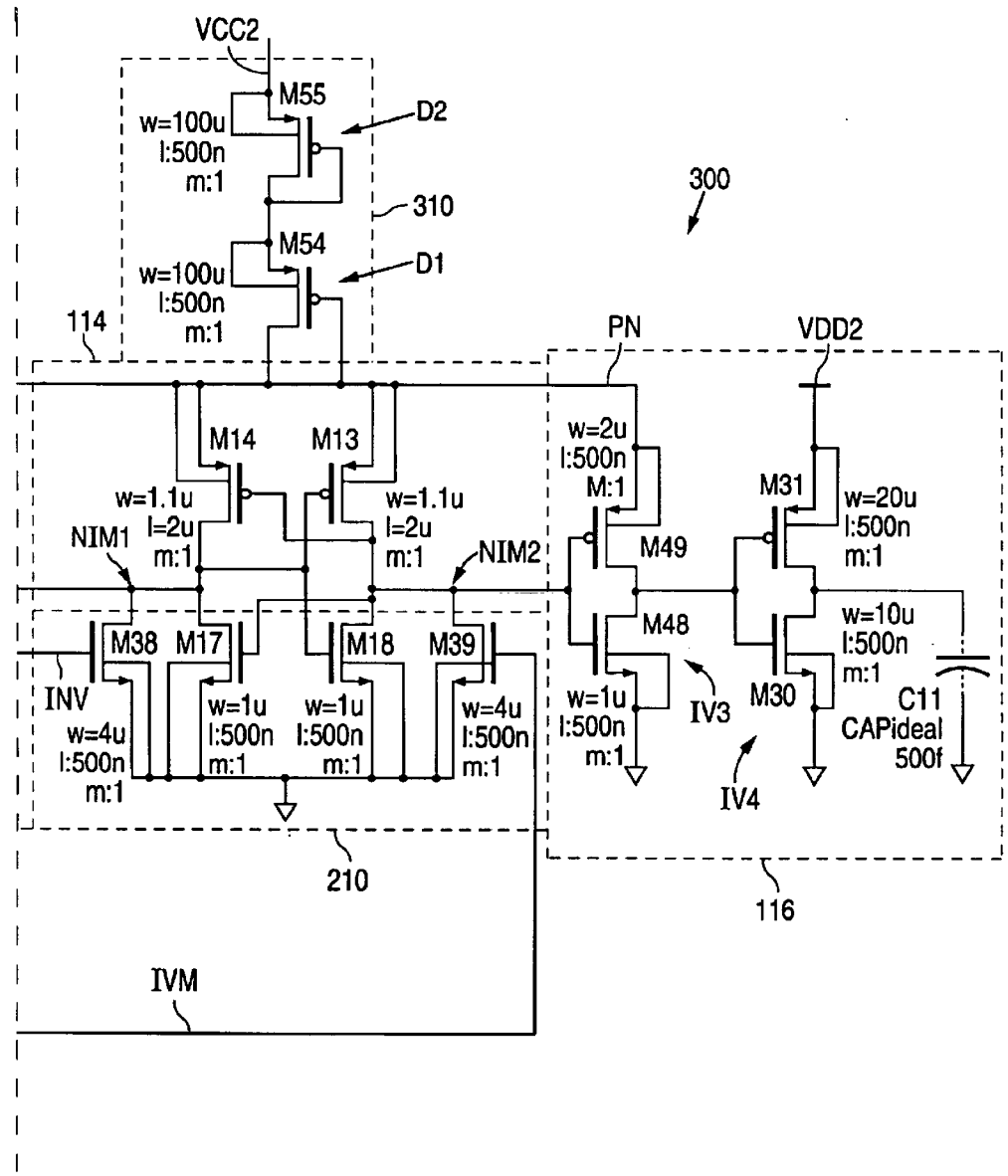

FIGS. 3A–3B show circuit diagrams that illustrate an example of a level shifter 300 in accordance with an alternate embodiment of the present invention. Level shifter 300 is similar to level shifter 200 and, as a result, utilizes the same reference numerals to designate the structures that are common to both level shifters.

As shown in FIGS. 3A–3B, level shifter 300 differs from level shifter 200 in that level shifter 300 includes a voltage drop stage 310 that includes a number of diodes D1–Dn. In the example shown in FIGS. 3A–3B, level shifter 300 includes two series-connected diodes D1 and D2. Diode D1 is implemented with a PMOS transistor M54 that has a source, a drain connected to a stepped down power node PN, and a gate connected to the drain of transistor M54.

Diode D2 is implemented with a PMOS transistor M55 that has a source connected to the second voltage VCC2, a drain connected to the source of transistor M54, and a gate connected to the drain of transistor M55. Level shifter 300 operates the same as level shifter 200, except that diodes D1–Dn provide the ability to receive a first voltage, such as 1.2 volts, output a level shifted voltage, such as 3.6 volts, while operating in a higher voltage environment, such as 5.5 volts.

One of the advantages of level shifter 300 is that level shifter 300 can maintain high-speed operation over a larger range of supply voltages. For example, when the second voltage source VCC2 is approximately 3.6V, one-half of that voltage is 1.8V. If NMOS transistor M48 has a threshold voltage of +1.0V (transistor M48 turns off when the voltage on the second intermediate node NIM2 falls below +1.0V), then the distance between the center voltage and the threshold voltage of transistor M48 is 0.8V.

On the other hand, when the second voltage source VCC2 is approximately 5.6V, one-half of that voltage is 2.8V. If NMOS transistor M48 has a threshold voltage of +1.0V, then the distance between the center voltage and the threshold voltage of transistor M48 is now 1.8V. As the distance between the center voltage and the threshold voltage continues to grow, the speed of inverter IV3 slows.

Thus, by utilizing voltage drop stage 310 to drop the supply voltage VCC2 from, for example, 5.6 volts to, for example, 3.6 volts, level shifter 300 can provide the same speed and performance as level shifter 200 while operating with a much higher supply voltage VCC2.

Inverters 200 and 300 can be changed from inverting level shifters to non-inverting level shifters by moving inverter IV4 to be connected to inverter IV5. In this case, inverter IV3 outputs a non-inverting voltage, while inverter IV4, which has its gates connected to the drains of transistors M52 and M53, also outputs a latched non-inverting voltage.

Figure 4:
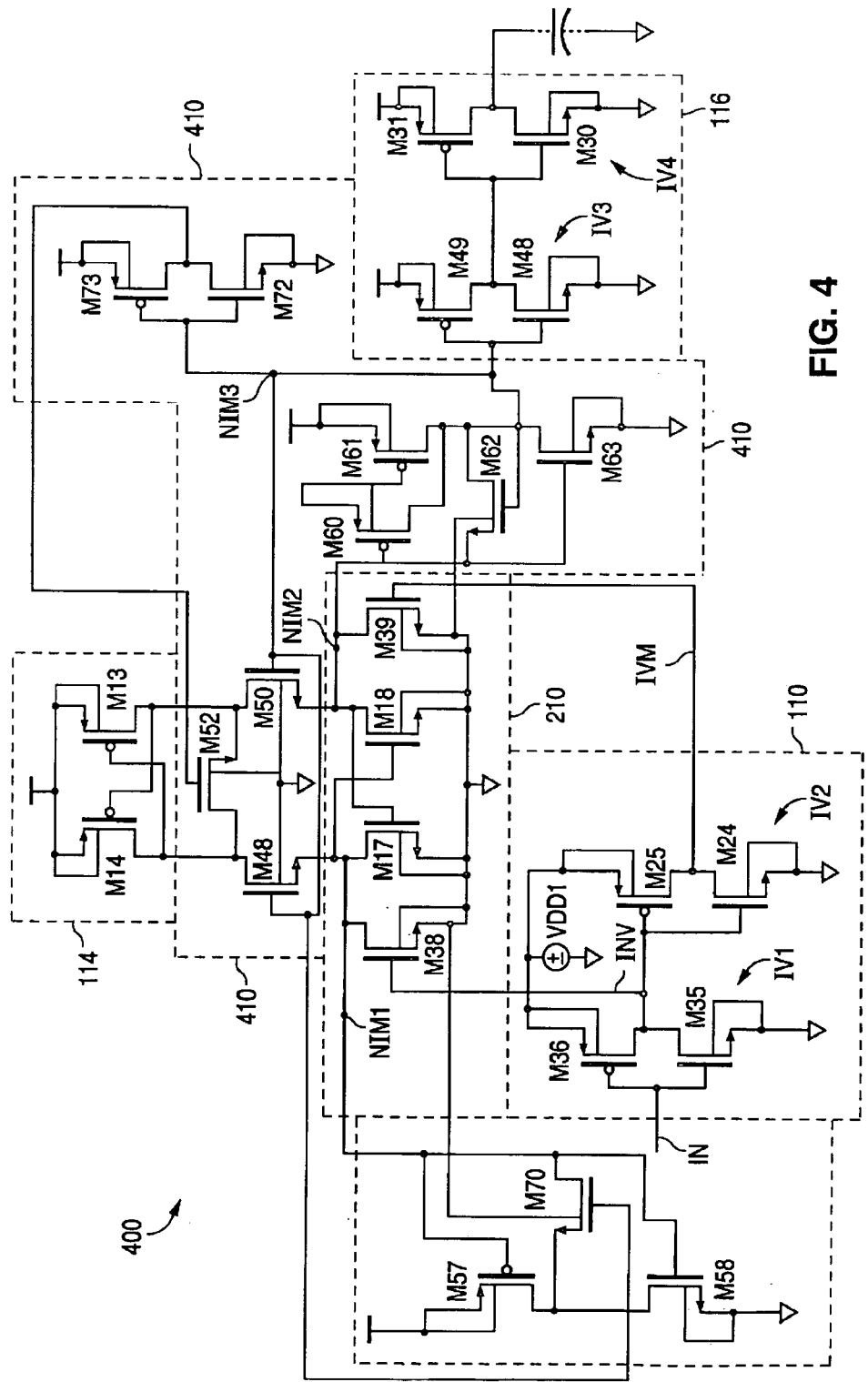
FIG. 4 is a circuit diagram illustrating an example of a level shifter 400 in accordance with an alternate embodiment of the present invention.

FIG. 4 shows a circuit diagram that illustrates an example of a level shifter 400 in accordance with an alternate embodiment of the present invention. Level shifter 400 is similar to level shifter 200 and, as a result, utilizes the same reference numerals to designate the structures which are common to both circuits.

As shown in FIG. 4, level shifter 400 differs from level shifter 200 in that level shifter 400 includes a precharge stage 410 that precharges the voltages on the inverters. Precharge stage 410 includes a blocking circuit that includes NMOS transistors M48, M50, and M52, and an inverter IV6.

Transistor M48 has a source connected to the drain of transistor M14, a drain connected to the first intermediate node NIM1, and a gate connected to a third intermediate node NIM3. (Transistor M48 also has w=1u, l=500n, and m=1.) Transistor M50 has a source connected to the drain of transistor M13, a drain connected to the second intermediate node NIM2, and a gate connected to the third intermediate node NIM3. (Transistor M50 also has w=1u, l=500n, and m=1.) Transistor M52 has a source connected to the drain of transistor M13, a drain connected to the drain of transistor M14, and a gate. (Transistor M52 also has w=100u, l=500n, and m=1.)

Precharge stage 410 also includes a sixth inverter IV6 that is connected to the block circuit. Inverter IV6 has a PMOS transistor M73 that has a source connected to the power supply VDD2, a drain connected to the gate of transistor M52, and a gate connected to the third intermediate node NIM3. (Transistor M73 also has w=2u, l=500n, and m=1.) In addition, sixth inverter IV6 also includes an NMOS transistor M72 that has a source connected to ground, a drain connected to the drain of PMOS transistor M73, and a gate connected to the third intermediate node NIM3. (Transistor M72 also has w=1u, l=500n, and m=1.)

Precharge stage 410 also includes a first charging circuit that includes PMOS transistor M60, PMOS transistor M61, NMOS transistor M62, and NMOS transistor M62. PMOS transistor M60 has a source connected to the second voltage VCC2, a drain, and a gate connected to the second intermediate node NIM2. (Transistor M60 also has w=2u, l=500n, and m=1.) PMOS transistor M61 that has a source connected to the second voltage VCC2, a drain connected to the drain of transistor M60, and a gate connected to the source of transistor M60. (Transistor M61 also has w=2u, l=500n, and m=1.)

NMOS transistor M62 has a source connected to the gate of transistor M60, a drain connected to the drains of transistors M60 and M61, and a gate connected to the third intermediate node NIM3. (Transistor M62 also has w=5u, l=500n, and m=1.) NMOS transistor M63 that has a source connected to ground, a drain connected to the drains of transistors M60 and M61, and a gate connected to the gate of transistor M60. (Transistor M63 also has w=5u, l=500n, and m=1.)

As further shown in FIG. 4, precharge stage 410 additionally includes a second charging circuit that includes PMOS transistor M57, NMOS transistor M70, and NMOS transistor M58. PMOS transistor M57 has a source connected to the second voltage VCC2, a drain, and a gate connected to the first intermediate node NIM1. (Transistor M57 also has w=2u, l=500n, and m=1.) NMOS transistor M70 has a source connected to the drain of transistor M57, a drain connected to the first intermediate node NIM1, and a gate connected to gate of transistor M62. (Transistor M70 also has w=5u, l=500n, and m=1.) NMOS transistor M58 that has a source connected to ground, a drain connected to the drain of transistor M57, and a gate connected to the first intermediate node NIM1. (Transistor M58 also has w=5u, l=500n, and m=1.)

In operation, when the input voltage IN is a logic high, transistor M39 turns on in response to the logic high of the non-inverted input signal IVM, and begins to pull down the voltage on the second intermediate node NIM2 to ground. Transistor M38, on the other hand, turns off in response to the logic low of the inverted input signal INV.

Since the gate of PMOS transistor M60 is also connected to the second intermediate node NIM2, the falling voltage turns on transistor M60. Transistor M60 pulls down the voltage on the gate of transistor M61, causing transistor M61 to turn on. When transistor M61 turns on, the voltage on the third intermediate node NIM3 rises. (The falling voltage on the second intermediate node NIM2 turns transistor M63 off.)

The rising voltage on the third intermediate node NIM3 turns on transistors M48 and M50. When transistor M50 turns on, the voltage on the gate of transistor M14 is pulled down, thereby turning on transistor M14. When transistor M14 turns on, the voltage on the first intermediate node NIM1 (via turned on transistor M48) begins to rise. The rising voltage on the first intermediate node NIM1 also turns on transistor M18 as described above.

The rising voltage on the first intermediate node NIM1 also turns off transistor M57, and turns on transistor M58. Since the gate of transistor M70 is connected to the third intermediate node NIM3, transistor M70 also turns on. When transistor M70 turns on, transistors M58 and M70 function as a voltage divider such that the drain of transistor M57 has a fractional value of the second source voltage VCC2. For example, the drain of transistor M57 can have a value equal to ($\frac{1}{2}$)VCC2.

The logic high on the third intermediate node NIM3 is also inverted by inverter IV6 which, in turn, turns off transistor M52. In addition, inverter IV3 inverts the logic high on the third intermediate node NIM3, and inverter IV4 inverts the output of inverter MV3 to drive a logic high at the level shifted voltage, e.g., 3.6 volts. Thus, level shifter 400 in the FIG. 4 example is non-inverting.

On the other hand, when the input voltage IN transitions to a logic low, transistor M38 turns on in response to the logic high of the inverted input signal INV, and begins to pull down the voltage on the first intermediate node NIM1 to ground. Transistor M39, on the other hand, turns off in response to the logic low of the non-inverted input signal IVM.

When transistor M39 turns off, the voltage on the second intermediate node NIM2 quickly rises to a fractional value of the second source voltage VCC2 due to the voltage dividing action of transistors M62 and M63. For example, the voltage on the second intermediate node NIM2 can rise to a value equal to ($\frac{1}{2}$)VCC2.

As transistor M38 continues to pull down the voltage on the first intermediate node NIM1, transistor M13 turns on and begins to charge the voltage on the second intermediate node NIM2. Since transistors M62 and M63 have precharged the voltage on the second intermediate node NIM2, transistor M13 need only charge up from, for example, (½)VCC2.

As the second intermediate node NIM2 charges up, transistor M63 turns on and pulls down the voltage on the third intermediate node NIM3. As the voltage falls on the third intermediate node NIM3, transistors M48 and M50 turn off. Inverter IV6 inverts the logic low on the third intermediate node NIM3 to turn on transistor M52.

When transistor M52 turns on, the charge on the drain of transistor M13 is shared with the charge on the drain of transistor M14. As a result, the drains of transistors M13 and M14 each hold a potential of approximately (½)VCC2. The rising voltage on the second intermediate node NIM2 also turns on transistor M17 as described above. Further, the falling voltage on the first intermediate node NIM1 also turns on transistor M57 which, in turn, causes the voltage on the drain of transistor M57 to rise to the second voltage source VCC2.

When the input voltage IN again transitions to a logic high, transistor M39 turns on in response to the logic high of the non-inverted input signal IVM, and begins to pull down the voltage on the second intermediate node NIM2 to ground. Transistor M38, on the other hand, turns off in response to the logic low of the inverted input signal INV.

As noted above, when transistor M39 turns on, transistor M61 turns on which, in turn, causes the voltage on the third intermediate node NIM3 to rise. When the voltage on the third intermediate node NIM3 rises, transistor M48 and M50 to turn on, and transistor M70 turns on.

When transistor M48 turns on, the precharged voltage on the drain of transistor M14 (e.g., (½)VCC2), appears on the first intermediate node NIM1. In addition, when transistor M70 turns on, approximately ½ of the voltage on the drain of transistor M57 (e.g., (½)VCC2) appears on the first intermediate node NIM1 due to the action of transistors M58 and M70. As a result, transistor M14 need only charge up from approximately (½)VCC2.

By precharging the first and second intermediate nodes NIM1 and NIM2, the speed of level shifter 400 can be increased. In addition, level shifter 400 has non-overlapping phases.

Figure 5:
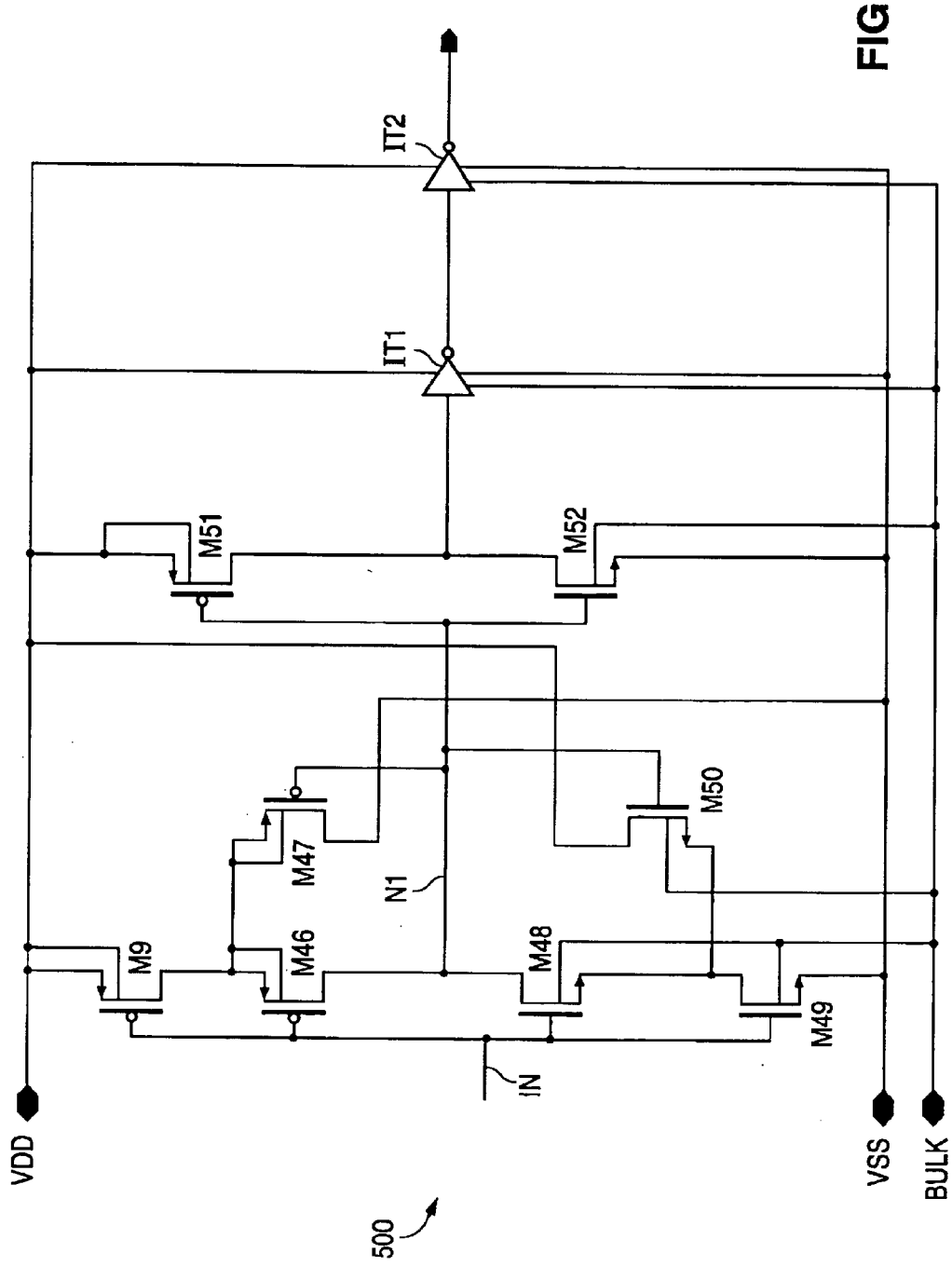
FIG. 5 is a circuit diagram illustrating a schmidt trigger circuit 500 in accordance with an alternate embodiment of the present invention.

FIG. 5 shows a circuit diagram that illustrates a schmidt trigger circuit 500 in accordance with an alternate embodiment of the present invention. As shown in FIG. 5, circuit 500 includes PMOS transistors M9, M46 and M47. PMOS transistor M9 has a source connected to a power supply voltage VDD, a drain, a gate connected to receive an input signal IN, and an n-bulk connected to the power supply voltage VDD.

PMOS transistor M46 has a source connected to the drain of transistor M9, a drain connected to an output node N1, a gate connected to receive the input signal IN, and an n-bulk connected to the drain of transistor M9. PMOS transistor M47 has a source connected to the drain of transistor M9, a drain connected to ground, a gate connected to the output node N1, and an n-bulk connected to the drain of transistor M9.

As further shown in FIG. 5, circuit 500 includes NMOS transistors M48, M49 and M50. NMOS transistor M48 has a source, a drain connected to the output node N1, a gate connected to receive the input signal IN, and a p-bulk connected to a p-bulk voltage PBULK such as ground. NMOS transistor M49 has a source connected to ground, a drain connected to the source of transistor M48, a gate connected to receive the input signal IN, and a p-bulk connected to a p-bulk voltage PBULK such as ground. NMOS transistor M50 has a source connected to the drain of transistor M49, a drain connected to the power supply voltage VDD, a gate connected to the output node N1, and an p-bulk connected to a p-bulk voltage PBULK such as ground.

In addition, circuit 500 can additionally include an inverter that has transistors M51 and M52, an inverter IT1 connected to transistors M51 and M52, and an inverter IT2 connected to inverter IT1. PMOS transistor M51 has a source connected to the power supply voltage VDD, a drain connected to inverter IT1, a gate connected to the output node N1, and an n-bulk connected to the power supply voltage VDD. NMOS transistor M52 has a source connected to ground, a drain connected to inverter IT1, a gate connected to the output node N1, and an p-bulk connected to a p-bulk voltage PBULK such as ground. (The n-bulks of the PMOS transistors can be separately connected to an n-bulk voltage, such as a voltage equal to the power supply voltage VDD.)

In operation, when the input signal IN is a logic low, PMOS transistors M9 and M46, and NMOS transistor M50 are turned on, while NMOS transistors M48 and M49, and PMOS transistor M47 are turned off. Transistors M9 and M46 source current to, and charge up the voltage on, the output node N1. The rising voltage on the output node N1, in turn, turns on transistor M50.

When the input signal IN changes logic states and begins to rise, transistor M49 turns on and, since transistor M50 is already on, sinks a current through transistor M50. Sinking a current through transistor M50 delays the turn on of transistor M48. Delaying the turn on of transistor M48, in turn, reduces the amount of time that transistors M9, M46, M48, and M49 are on at the same time, thereby reducing the shoot through current.

When the input signal IN is a logic high, PMOS transistors M9 and M46, and NMOS transistor M50 are turned off, while NMOS transistors M48 and M49, and PMOS transistor M47 are turned on. Transistors M48 and M49 sink current from, and pull down the voltage on, the output node N1. The falling voltage on the output node N1, in turn, turns on transistor M47.

When the input signal IN changes logic states and begins to fall, transistor M9 turns on and, since transistor M47 is already on, sources a current through transistor M47. Sourcing a current through transistor M47 delays the turn on of transistor M46. Delaying the turn on of transistor M46, in turn, reduces the amount of time that transistors M9, M46, M48, and M49 are on at the same time, thereby reducing the shoot through current. A schmidt trigger circuit 500 can be used in lieu of an inverter.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A level shifter comprising:

an input stage that outputs a first signal, and outputs a second signal in response to the first signal, the first and second signals having opposite logic states, the second signal having a maximum voltage;

a pull down stage connected to a first intermediate node, a second intermediate node, and the input stage, the pull down stage pulling down a voltage on the first intermediate node when the first signal has a first logic state, and pulling down a voltage on the second intermediate node when the first signal has a second logic state, the pull down stage including:
   a first transistor connected to the first intermediate node, the input stage, and ground,
   a second transistor connected to the first intermediate node, the second intermediate node, and ground,
   a third transistor connected to the input stage, the second intermediate node, and ground, and
   a fourth transistor connected to the first intermediate node, the second intermediate node, and ground;

a pull-up stage that pulls up the voltage on the first intermediate node to a level shifted voltage greater than the maximum voltage when the first signal has the second logic state, and pulls up the voltage on the second intermediate node to the level shifted voltage when the first signal has the first logic state;

a first inversion circuit that outputs a voltage with a logic state, the logic state of the voltage output by the first inversion circuit being opposite to a logic state of the voltage on the second intermediate node; and a blocking circuit that has a fifth transistor connected to the first intermediate node and the pull up stage, and a sixth transistor connected to the second intermediate node and the pull up stage, the blocking circuit further includes a seventh transistor connected to the fifth and sixth transistors.

2. The level shifter of claim 1 and further comprising a first charging circuit, the first charging circuit having:

an eighth transistor connected to the second intermediate node and the first inversion circuit;

a ninth transistor connected to the second intermediate node, the first inversion circuit, and ground; and a tenth transistor connected to the second intermediate node, the first inversion circuit, and a power node.

3. The level shifter of claim 2 and further comprising a second inversion circuit connected to the fifth, sixth, seventh, eighth, ninth, and tenth transistors and the first inversion circuit.

4. The level shifter of claim 3 and further comprising a third inversion circuit connected to the first inversion circuit.

5. A level shifter comprising:

an input stage that outputs a first signal that has a first logic state and a second logic state, and a second signal in response to the first signal, the first and second signals having opposite logic states, the second signal having a maximum voltage;

a pull-up stage that pulls up a voltage on a first intermediate node to a level shifted voltage different than the maximum voltage when the first signal has the second logic state, and pulls up a voltage on a second intermediate node to the level shifted voltage when the first signal has the first logic state, the first intermediate node being isolated from the second intermediate node;

a pull-down stage connected to the first intermediate node, the second intermediate node, and the input stage, the pull-down stage pulling down the voltage on the first intermediate node when the first signal has the first logic state, and pulling down the voltage on the second intermediate node when the first signal has the second logic state;

a precharge circuit connected to the first intermediate node, the second intermediate node, the pull-up stage, the pull-down node, and a third intermediate node; and an inversion circuit having an input connected to the third intermediate node and an output node, the inversion circuit forming an output voltage on the output node, a logic state of the output voltage being opposite to a logic state of a voltage on the third intermediate node.

6. The level shifter of claim 5 wherein the precharge circuit includes:

a first transistor having a source connected to the first intermediate node, drain connected to the pull up stage, and a gate connected to the third intermediate node; and a second transistor having a source connected to the second intermediate node, a drain connected to the pull up stage, and a gate connected to the third intermediate node.

7. The level shifter of claim 6 wherein the precharge circuit further includes:

a third transistor having a first terminal connected to the first transistor, a second terminal connected to the second transistor, and a third terminal; and an inverter having an input connected to the third intermediate node, and an output connected to the third terminal.

8. The level shifter of claim 7 wherein the precharge circuit further comprises a first charging circuit connected to the second intermediate node and the third intermediate node, the first charging circuit sourcing current into the third intermediate node when the voltage on the second intermediate node is pulled down, and sinking current from the third intermediate node when the voltage on the second intermediate node is pulled up.

9. The level shifter of claim 8 wherein the precharge circuit additionally comprises a second charging circuit connected to the first intermediate node and the third intermediate node, the second charging circuit sourcing a charge into the first intermediate node when the voltage on the third intermediate node is pulled up.

10. The level shifter of claim 5 wherein the precharge circuit comprises a first charging circuit connected to the second intermediate node and the third intermediate node, the first charging circuit sourcing current into the third intermediate node when the voltage on the second intermediate node is pulled down, and sinking current from the third intermediate node when the voltage on the second intermediate node is pulled up.

11. The level shifter of claim 10 wherein the first charging circuit includes:

a first transistor having a source connected to ground, a drain connected to the third intermediate node, and a gate connected to the second intermediate node; and a second transistor having a source connected to the second intermediate node, a drain connected to the third intermediate node, and a gate connected to the third intermediate node.

12. The level shifter of claim 10 wherein the precharge circuit further comprises a second charging circuit connected to the first intermediate node and the third intermediate node, the second charging circuit sourcing a charge into the first intermediate node when the voltage on the third intermediate node is pulled up.

13. The level shifter of claim 12 wherein the second charging circuit includes:
a first transistor having a source connected to ground, a drain, and a gate connected to the first intermediate node; and
a second transistor having a source connected to the drain of the first transistor, a drain connected to the first intermediate node, and a gate connected to the third intermediate node.

14. The level shifter of claim 5 wherein the inversion circuit is an inverter.

15. The level shifter of claim 5 wherein the inversion circuit is a Schmidt trigger having:
a first transistor having a source connected to a voltage source, a drain, and a gate connected to an input node;
a second transistor having a source connected to the drain of the first transistor, a drain connected to an internal node, and a gate connected to the input node; and
a third transistor having a source connected to the drain of the first transistor, a drain connected to ground, and a gate connected to the internal node.

16. The level shifter of claim 15 wherein the Schmidt trigger further includes:
a fourth transistor having a source connected to ground, a drain, and a gate connected to the input node;
a fifth transistor having a source connected to the drain of the fourth transistor, a drain connected to the internal node, and a gate connected to the input node;
a sixth transistor having a source connected to the drain of the fourth transistor, a drain connected to the voltage source, and a gate connected to the internal node; and
an inversion circuit having an input connected to the internal node, and an output that outputs a voltage having a logic state opposite to a logic state on the internal node.

\* \* \* \* \*

UNITED STATES PATENT AND TRADEMARK OFFICE
CERTIFICATE OF CORRECTION

PATENT NO. : 6,838,905 B1
DATED : January 4, 2005
INVENTOR(S) : Doyle

It is certified that error appears in the above-identified patent and that said Letters Patent is hereby corrected as shown below:

Title page,
Item [56], References Cited, OTHER PUBLICATIONS, "Dragan Maksimovic and Sandeep Dhar," reference, delete "10/053,828" and replace with -- 10/053,858 --.
"Dragan Maksimovic and Sandeep Dhar," reference, delete "Lev el" and replace with -- Level --. "James T. Doyle and Dragan Maksimovic, reference, delete "10/160,428" and replace with -- 10/106,428 --.

Column 5,
Line 11, delete "turns-on" and replace with -- turns on --.
Line 63, delete "MV3" and replace with -- IV3 --.

Column 8,
Line 51, delete "MV3" and replace with -- IV3 --.

Signed and Sealed this

Twenty-sixth Day of April, 2005

JON W. DUDAS
*Director of the United States Patent and Trademark Office*